US012562940B2

(12) United States Patent
Shim et al.

(10) Patent No.: US 12,562,940 B2
(45) Date of Patent: Feb. 24, 2026

(54) SYSTEMS AND METHODS FOR INTERFERENCE CANCELLATION

(71) Applicant: Avago Technologies International Sales Pte. Limited, Singapore (SG)

(72) Inventors: Yonghyun Shim, Irvine, CA (US); Guansheng Li, Irvine, CA (US); Delong Cui, Tustin, CA (US); Jun Cao, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 18/787,966

(22) Filed: Jul. 29, 2024

(65) Prior Publication Data

US 2026/0032022 A1     Jan. 29, 2026

(51) Int. Cl.
H04L 25/03 (2006.01)
H03L 7/08 (2006.01)
H04L 25/14 (2006.01)

(52) U.S. Cl.
CPC .......... H04L 25/03019 (2013.01); H03L 7/08 (2013.01); H04L 25/14 (2013.01)

(58) Field of Classification Search
CPC ... H04L 1/0003; H04L 1/0009; H04L 5/0053; H04L 5/0007; H04L 5/0048; H04L 5/0044; H04L 1/0026; H04L 5/0023; H04L 25/0204; H04L 5/0094; H04L 1/06; H04L 1/0048; H04L 1/1812; H04W 72/23; H04W 16/14; H04W 72/541; H04W 72/0453; H04W 72/0446; H04W 16/28;

(Continued)

(56) References Cited

U.S. PATENT DOCUMENTS 8,867,650 B2    10/2014  Huang et al.
9,689,967 B1 *   6/2017  Stark ..................... G01S 7/0233
(Continued)

FOREIGN PATENT DOCUMENTS

CN      102647374 A    8/2012
EP       3248295 B1    2/2019

OTHER PUBLICATIONS

Fu, D. et al., A Digital Background Calibration Technique for Time-Interleaved Analog-to-Digital Converters, IEEE Journal of Solid-State Circuits, 1998, 33(12):1904-1911.

(Continued)

*Primary Examiner* — Eva Y Puente
(74) *Attorney, Agent, or Firm* — Quarles & Brady LLP

(57)           ABSTRACT

An apparatus for canceling clock-to-signal interference in a multi-lane SerDes comprising an analog front-end circuit receiving an input signal from a signal path mixed with interference from a clock path. The apparatus includes a phase interpolator circuit implemented in the clock path to generate multiple phases of a clock signal and to provide a timing rotated by the phases for a track-and-hold circuit to sample the input signal and the interference in every cycle. The apparatus also includes an analog-to-digital converter configured to digitize the input signal and the interference to provide an ADC output and a digital-interference-cancellation circuit configured to demultiplex the ADC output and detect a baseline offset associated with the interference sampled at one of the phases in each demultiplexed path using a digital loop to calibrate the baseline offset.

20 Claims, 6 Drawing Sheets

(58) Field of Classification Search

CPC ...... H04W 24/02; H04W 52/243; H04B 1/16; H04B 1/28; H04B 1/707; H04B 3/23; H04B 1/123; H04B 1/719; H04B 15/04; H04B 1/18; H04B 1/7075; H04B 3/32; H04B 1/02; H04B 1/10; H04B 1/71637; H04B 1/7183

See application file for complete search history.

(56) References Cited

U.S. PATENT DOCUMENTS

| | | | |
|---|---|---|---|
| 10,447,506 B1 * | 10/2019 | Farjadrad | H04L 25/40 |
| 2015/0049834 A1 * | 2/2015 | Choi | H04B 7/0413 |
| | | | 375/285 |
| 2015/0270865 A1 * | 9/2015 | Polydoros | H04B 1/62 |
| | | | 375/346 |
| 2017/0163295 A1 | 6/2017 | Talty et al. | |
| 2017/0170999 A1 * | 6/2017 | Zhou | H04B 1/123 |
| 2018/0013434 A1 * | 1/2018 | Amirkhany | H04L 47/29 |
| 2025/0096827 A1 * | 3/2025 | Lu | H04B 1/0475 |

OTHER PUBLICATIONS

Guo, M. et al., A 1.6-GS/s 12.2-mW Seven-/Eight-Way Split Time-Interleaved Sar Adc Achieving 54.2-dB SNDR With Digital Background Timing Mismatch Calibration, IEEE Journal of Solid-State Circuits, 2020, 55(3):693-705.

Sadjina, S., Mixed-Signal Interference Mitigation in Cellular Receivers, Doctoral Thesis, Johannes Kepler University Linz, Dec. 2019, 149 pages.

Du, J. et al., A 7.5-m W 10-GB/s 16-QAM Wireline Transceiver with Carrier Synchronization and Threshold Calibration for Mobile Inter-chip Communications in 16-nm FinFET, In International Symposium on Networks-on-Chip (NOCS'19), 2019, 8 pages.

Nguyen, V., et al., Analysis of Time-Interleaved Delta-Sigma Analog to Digital Converter, VTC Spring 2002, IEEE 55th Vehicular Technology Conference Proceedings, IEEE, 2002, vol. 4, pp. 1594-1597.

Razavi, B., Principles of Data Conversion System Design, IEEE Press, Copyright 1995 by AT&T, 135 pages.

European Patent Office, Extended Search Report, Application No. 25191728.2, Jan. 8, 2026, 15 pages.

* cited by examiner (A) Coupled clock noise: I-domain scanning coarse control with Q-domain coarse control at default 00

(B) Coupled clock noise: Q-domain scanning coarse control with I-domain coarse control at 04

(A) Coupled clock noise: comparison of initial state, coarse scan, and final calibration

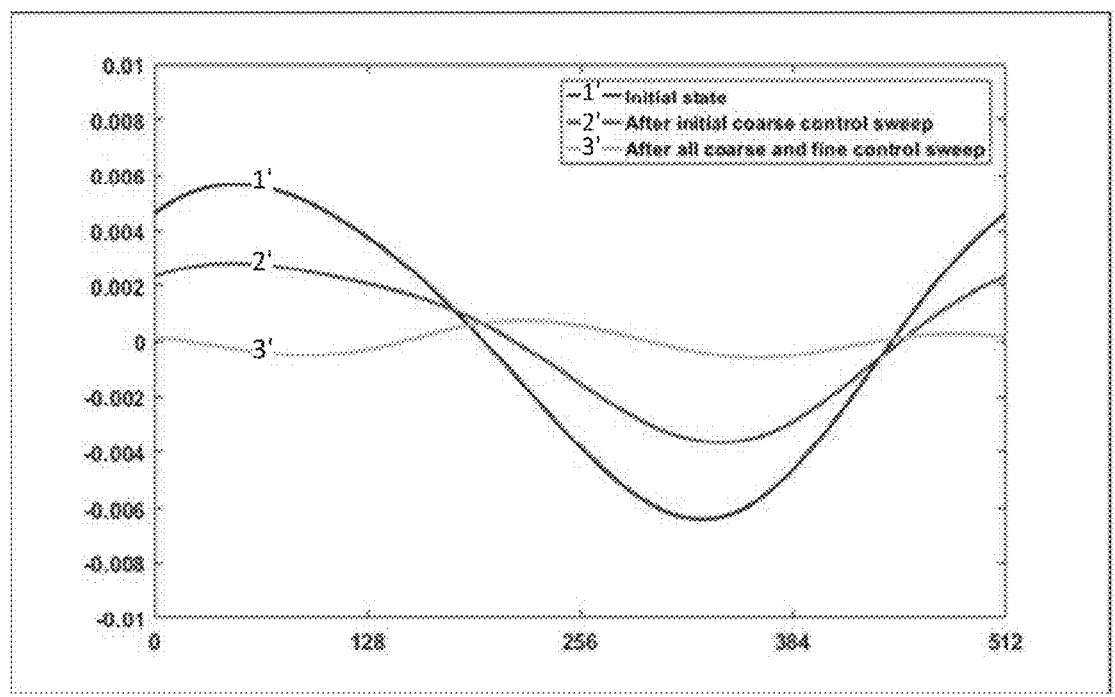

(B) Coupled clock noise after one or more rounds of scan through analog cancellation

| Analog cancellation | Residue clock noise |
|---|---|
| Initial state | 12.0 mVpp |
| First round of coarse control scan | 6.4 mVpp |
| Second round of coarse control scan | 3.8 mVpp |
| Third round of coarse control scan | 1.6 mVpp |
| Fine control scan | 1.2 mVpp |

FIG. 6

SYSTEMS AND METHODS FOR INTERFERENCE CANCELLATION

BACKGROUND OF THE INVENTION

High-density switch chips, integral to modern communications, are increasingly incorporating hundreds of high-speed Serializer/Deserializer (SerDes) lanes into compact areas. These SerDes lanes, each potentially operating at subtly different frequencies, present a considerable challenge in terms of efficient design and interference management.

To address this challenge, many of today's advanced SerDes architectures for speeds of 50 Gb/s and higher (such as those employing PAM4 signaling with ADC-DSP technology) use a phase interpolator (PI). This design choice enables multiple lanes to share a single phase-locked loop (PLL), which significantly conserves both power and chip area. The phase interpolator adjusts to match the frequency discrepancies between the transmitter (Tx) and receiver (Rx), allowing for synchronous operation without a dedicated PLL for each lane.

However, this approach introduces its own set of complications. As more circuits operating at different frequencies are packed into smaller areas, interference becomes a notable issue. This interference, often resulting from clock signals coupling with the data signal paths, can occur through various means such as power, ground, substrate coupling, or electromagnetic interference. Such coupling is particularly problematic when the PI compensates for frequency offsets between the Tx and Rx, manifesting as unwanted tones at the offset frequency in the signal path.

This type of interference can substantially degrade the signal's signal-to-noise ratio (SNR) and bit error rate (BER), issues that have been observed in several past products. The mitigation of clock-to-signal interference through traditional analog design and layout techniques alone proves to be a formidable task. The fundamental physical limits, coupled with the limitations in the accuracy of modeling and simulation tools, make it difficult to fully predict and counteract these interference effects. Therefore, improved apparatus and methods are desired.

BRIEF DESCRIPTION OF THE DRAWINGS

A further understanding of the nature and advantages of particular embodiments may be realized by reference to the remaining portions of the specification and the drawings, in which reference numerals are used to refer to similar components. In some instances, a sub-label is associated with a reference numeral to denote one of multiple similar components. When reference is made to a reference numeral without specification to an existing sub-label, it is intended to refer to all such multiple similar components.

FIG. 6 shows (A) simulation results and (B) table lists of coupled clock noises through one or more rounds of scan in the analog cancellation according to an embodiment of the subject technology.

DETAILED DESCRIPTION OF THE INVENTION

Figure 1:
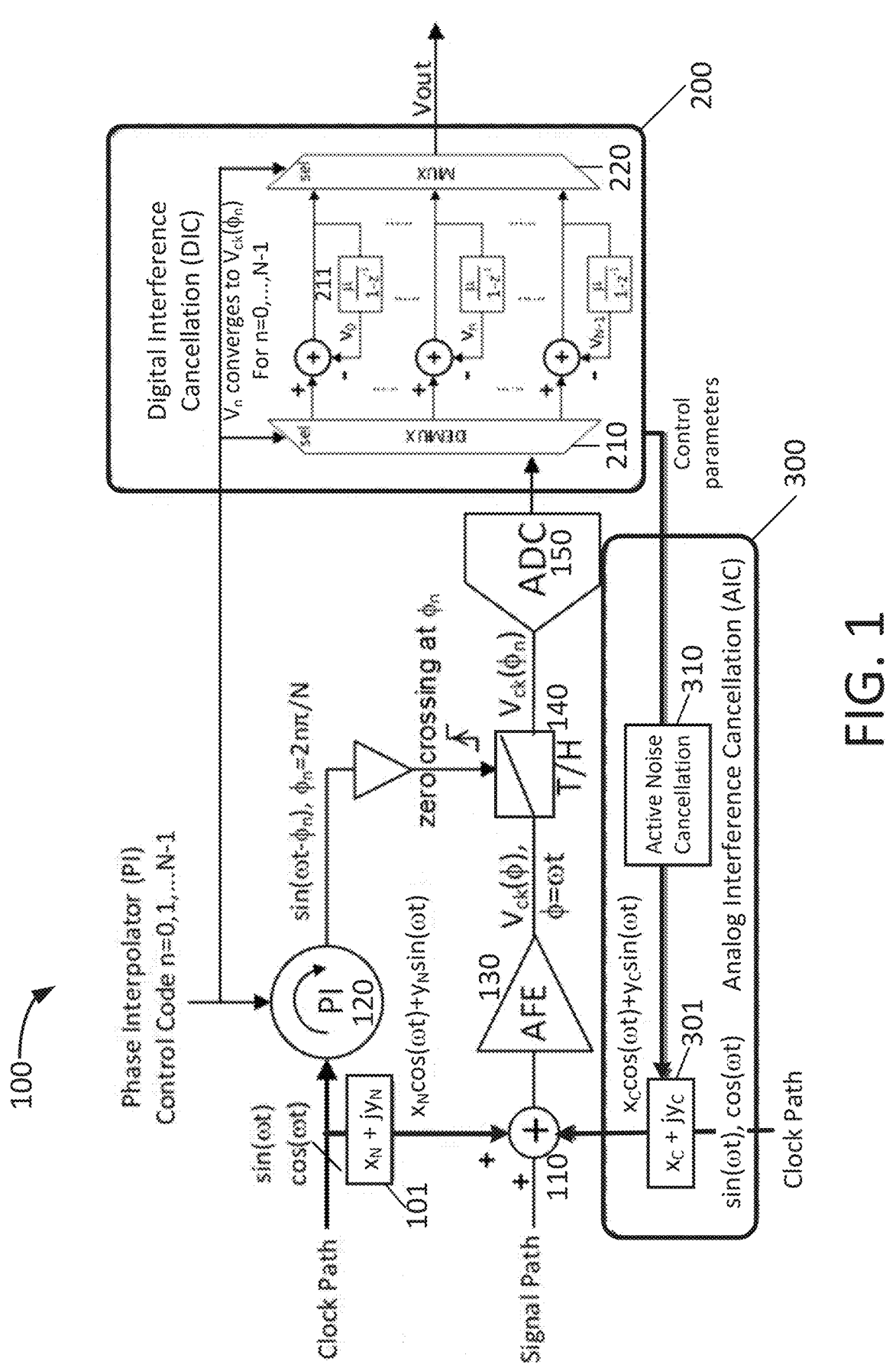
FIG. 1 is a simplified block diagram of an apparatus for canceling clock-to-signal interference in both digital and analog domains according to an embodiment of the subject technology.

The subject technology provides an apparatus for mixed domain cancellation of clock-to-signal interference in a multi-lane Serializer/Deserializer (SerDes). The apparatus receives an input signal from a signal path mixed with an interference from a clock path. The apparatus includes a digital-interference-cancellation (DIC) circuit configured to detect a baseline offset associated with the interference sampled at one of multiple phases and includes an analog-interference-cancellation (AIC) circuit to use an input based on the baseline offset in a calibration loop to generate a cancellation signal. The cancellation signal is injected back into the signal path to cancel a major part of the clock-to-signal interference by operating the AIC circuit in the foreground and continuously operating the DIC circuit in the background to cancel residue coupled clock noise. There are other embodiments as well.

The following description is presented to enable one of ordinary skill in the art to make and use the invention and to incorporate it in the context of particular applications. Various modifications, as well as a variety of uses in different applications, will be readily apparent to those skilled in the art, and the general principles defined herein may be applied to a wide range of embodiments. Thus, the present invention is not intended to be limited to the embodiments presented but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent, or similar purpose unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

Moreover, the terms left, right, front, back, top, bottom, forward, reverse, clockwise, and counterclockwise are used for purposes of explanation only and are not limited to any fixed direction or orientation. Rather, they are used merely to indicate relative locations and/or directions between various parts of an object and/or components.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term "about." In this application, the use of the singular includes the plural unless specifically stated otherwise, and use of the terms "and" and "or" means "and/or" unless otherwise indicated. Moreover, the use of the terms "including" and "having," as well as other forms, such as "includes," "included," "has," "have," and "had," should be considered non-exclusive. Also, terms such as "element" or "component" encompass both elements and components comprising one unit and elements and components that comprise more than one unit, unless specifically stated otherwise.

As used herein, the phrase "at least one of" preceding a series of items, with the term "and" or "or" to separate any of the items, modifies the list as a whole, rather than each member of the list (i.e., each item). The phrase "at least one of" does not require the selection of at least one of each item listed; rather, the phrase allows a meaning that includes at least one of any one of the items, and/or at least one of any combination of the items. By way of example, the phrases "at least one of A, B, and C" or "at least one of A, B, or C" each refer to only A, only B, or only C; and/or any combination of A, B, and C. In instances where it is intended that a selection be of "at least one of each of A, B, and C," or alternatively, "at least one of A, at least one of B, and at least one of C," it is expressly described as such.

One general aspect includes an apparatus for canceling clock-to-signal interference in a multi-lane serializer/deserializer (SerDes). The apparatus also includes an analog front-end (AFE) module receiving an input signal from a signal path mixed with an interference signal from a clock path. For example, the term "module" is intended to encompass various types of implementations, including but not limited to hardware, software, firmware, or a combination thereof. The apparatus also includes a track-and-hold (T/H) circuit configured to sample the input signal. The apparatus also includes a phase interpolator implemented in the clock path and configured to generate multiple phases of a clock signal and to provide a timing rotated by the phases for the T/H circuit to sample the input signal and the interference signal in every cycle. The apparatus also includes an ADC configured to digitize the input signal and the interference signal to provide an ADC output. The apparatus also includes a DIC circuit configured to demultiplex the ADC output and detect a baseline offset associated with the interference signal sampled at one of the phases in each demultiplexed path using a digital loop to calibrate the baseline offset. For example, the term "interference signal" refers to an unwanted signal mixed with the desired input signal, typically originating from clock paths or other sources. For example, an interference signal may encompass any form of unwanted signal that affects the quality of the desired signal and can be mitigated using various digital and analog methods.

For example, the AFE module refers to a set of analog circuitry directly connected to the physical interface of a system, which processes raw analog signals from external sources before they are converted to digital form for further digital processing. An AFE module may include various types of analog circuits such as amplifiers, filters, and other components configured to process analog signals in different ways depending on the application. In SerDes technology, phase interpolators are used to align the clock signal with the incoming data stream, optimizing the timing of data sampling and improving the overall data throughput and reliability. The T/H circuit is configured to capture (hold) a snapshot of an analog signal at a specific moment in time, making it available for subsequent processing, most commonly analog-to-digital conversion. In an embodiment, the T/H circuit is configured to sample the input signal and the interference signal based on a timing rotated in the phases generated by a phase interpolator. For example, a T/H circuit may include different configurations and technologies, including various sampling methods and timing mechanisms, to capture and hold analog signals for subsequent processing. In a tracking mode, the T/H circuit continuously follows or 'tracks' the input analog signal. It acts like a buffer, passing the input signal through to the output without any alteration, thereby maintaining a real-time output that mirrors the incoming signal's instantaneous values. When the circuit switches to hold mode, it captures and locks the last tracked value of the input signal, effectively 'holding' this value constant. This held value remains stable and unchanged regardless of any further fluctuations in the input signal. This mode is essential for stabilizing the signal long enough to allow for accurate sampling and ADC conversion.

Implementations may include one or more of the following features. The phase interpolator is configured to apply phase shifts of $2\pi n/N$ to generate the multiple phases, where n is an integer control code variable from 0 to N-1, to allow the T/H circuit to provide one sampled interference at corresponding one of the phases for a given n. The DIC circuit is configured to detect the baseline offset resulting from the sampled interference at the same phase in every cycle for the control code n being at a fixed value. The DIC circuit may include a 1-to-N demultiplexer configured to demultiplex the ADC output to N paths, each path corresponding to the control code n may include a digital accumulation filter to at least cancel a component of the baseline offset associated with the phase of $2\pi n/N$. The digital accumulation filter may include an adaptive feedback loop using a factor of $\mu/(1-Z^{-1})$ to obtain an accumulated value in each demultiplexed path, where u is an adaptive rate and $Z^{-1}$ represents a unit delay in the digital filter domain. The DIC circuit may further include an N-to-1 multiplexer to recombine the N paths to produce a single output with the accumulated value for each path being collectively recombined to cancel the baseline offset resulting from the sampled interference. The DIC circuit is configured to be implemented in a background operation with the adaptive feedback loops concurrently with ongoing signal transmission with variations of process, voltage, and temperature. The apparatus further may include an AIC circuit configured with in-phase-quadrature (IQ) clock buffers in the clock path, the AIC circuit may include a noise cancellation circuit configured to receive control parameters based on the baseline offset detected by the DIC circuit to generate an analog cancellation signal in a calibration loop. The calibration loop is configured to use the control parameters in the IQ clock buffers to conduct iterative coarse/fine scans on finding real and imaginary components of the analog cancellation signal. The AIC circuit is configured to operate in the foreground at system start-up time to inject the analog cancellation signal to the signal path to minimize a residue coupled clock noise entering the ADC circuit. The DIC circuit is configured to detect an additive periodic offset resulting from the sampled interference appearing at a rotating frequency given by $2\pi n/N$ for the control code n increasing linearly to track transmitting-receiving frequency offset. The DIC circuit is configured to detect a random offset resulting from the sampled interference for the control code n changing randomly due to random jitter. The T/H circuit is configured to sample the input signal as well as the interference signal with an optimized timing by detecting zero-crossings of the clock signal shifted by the multiple phases of $2\pi n/N$.

One general aspect includes an apparatus for canceling clock-to-signal interference in a multi-lane serializer/deserializer (SerDes). The apparatus also includes an AFE module configured to receive an input signal from a signal path mixed with an interference signal from a clock path. The apparatus also includes a phase interpolator (PI) circuit implemented in the clock path and configured to generate multiple phases of a clock signal. The apparatus also includes a T/H circuit configured to sample the input signal and the interference signal based on a timing rotated in the phases generated by the PI circuit in every cycle. The apparatus also includes an ADC configured to provide an ADC digital output based on a sampled input signal and a sampled interference at each of the multiple phases. The apparatus also includes a DIC circuit configured to detect the sampled interference by demultiplexing the ADC digital output into multiple paths each may include a digital adaptive loop. The apparatus also includes an AIC circuit implemented in the clock path to generate a cancellation signal based on a calibration loop using control parameters from the DIC circuit and to inject the cancellation signal to the signal path for canceling at least a part of the interference signal.

Implementations may include one or more of the following features. The PI circuit is configured to apply phase shifts of $2\pi n/N$ to generate the multiple phases, where n is an integer control code variable from 0 to N-1, to allow the T/H circuit to provide one sampled interference at corresponding one of the phases for a given n for the ADC circuit. The DIC circuit is configured to detect a baseline offset in each digital adaptive loop at the phase of $2\pi n/N$ in every cycle per each n of N demultiplexing paths, where the accumulation of all baseline offsets in the N demultiplexing paths leads to the determination of the control parameters for minimizing the amplitude of the sampled interference. The AIC circuit is configured to determine a real-part component and an imaginary-part component in a calibration loop to generate the cancellation signal with a minimized residue difference in amplitude but with 180 degrees of phase difference relative to the interference signal. The calibration loop is configured to independently determine the real-part component and the imaginary-part component using the control parameters in iterative coarse-control scans and fine-control scans. The AIC circuit may include a coupling cancellation circuit may include four unit buffers for respectively tuning original and inverted in-phase and quadrature-phase components (I, Q, IB, QB) to perform the coarse-control scans, each unit buffer may include multiple sub-unit buffers each having a switch array to perform the fine-control scans.

One general aspect includes a method for canceling clock-to-signal interference in a multi-lane serializer/deserializer (SerDes). The method also includes receiving an input signal from a signal path mixed with an interference signal from a clock path. The method also includes implementing a phase interpolator (PI) in the clock path to generate multiple phases of a clock signal. The method also includes sampling the input signal and the interference signal based on a timing rotated in the phases generated by the PI in every cycle. The method also includes providing an ADC digital output based on a sampled input signal and a sampled interference at each of the phases. The method also includes detecting the sampled interference by demultiplexing the ADC digital output and canceling at least partially a component of the interference signal in each demultiplexed path using a digital adaptive loop to calibrate the sampled interference. The method also includes generating an analog cancellation signal based on a calibration loop using control parameters determined in the digital adaptive loop. The method also includes injecting the analog cancellation signal into the signal path for at least canceling a part of the interference signal.

FIG. 1 is a simplified block diagram of an apparatus for canceling clock-to-signal interference in both digital and analog domains according to an embodiment of the subject technology. This diagram is merely an example, which should not unduly limit the scope of the claims. One of ordinary skill in the art would recognize many variations, alternatives, and modifications. As shown in an embodiment, FIG. 1 provides an apparatus 100 to address clock-to-signal interference using a mixed-domain approach, leveraging both analog and digital cancellation methods. The Apparatus 100 is aimed to effectively mitigate interference due to complicated power/ground/substrate coupling or electromagnetic coupling in all kinds of process, voltage, and temperature (PVT) variations, which cause clock signals to affect the desired communication signal. Based on apparatus 100 shown in FIG. 1, a mixed analog/digital domain cancellation method based on calibration loops to cancel clock-to-signal coupling is provided.

Referring to the FIG. 1, apparatus 100 is associated with a high-speed multi-lane Serializer/Deserializer (SerDes) sharing the same phase-locked loop (PLL) with a phase interpolator (PI) 120 in a clock path coupled to every signal path. The PI 120 is configured to take a clock signal (with a frequency $\omega$) and adjust its phase based on an integer control code n to generate the multiple phases in terms of $\phi_n=2\pi n/N$, n=0,1, . . . , N-1. This creates phase-shifted clock signals, expressed by $\sin(\omega t-\phi_n)$ and $\cos((\omega t-\phi_n)$. These phase-shifted clock signals are used to synchronize with the incoming communication signal. The PI allows fine control over the phase of the clock, which helps align the sampling clock with the incoming signal from the signal path. According to an embodiment, the PI circuit generates multiple phases of a clock signal and provides a timing rotated by the phases for the T/H circuit. For example, a phase interpolator may be implemented using various technologies and methods to produce multiple phase-shifted clock signals for timing adjustments in different types of electronic circuits.

Apparatus 100 includes an AFE module 130 to process the input (analog) signal before it enters the digital domain. It amplifies and filters the input signal to prepare it for sampling. The AFE 130 includes an injection node 110 that combines the input signal with the output of the PI 120, aligning the signal with the desired phase among one of multiple phases of $\phi_n=2\pi n/N$.

The T/H circuit 140 samples the output of the AFE 130. T/H 140 holds the sampled value momentarily to stabilize the signal before digital conversion. In an embodiment, T/H 140 is configured to sample the AFE output (including the input signal mixed with the interference) using an optimized timing by detecting zero-crossings of the clock signal shifted by the multiple phases of $2\pi n/N$. This stage is to ensure that the signal is accurately captured during conversion.

The ADC 150 converts the sampled analog signal (mixed with the clock-to-signal interference) from the T/H circuit 140 into a digital format. This conversion provides an ADC output to the subsequent digital domain for further processing interference cancellation. For example, an ADC digitizes the input signal and the interference signal to provide an ADC output. An ADC may include various types of converters with different resolutions and sampling rates, and can be configured to process signals in a wide range of applications.

In an embodiment, apparatus 100 for mixed-domain interference cancellation includes a DIC circuit 200 receives the ADC output. The DIC circuit 200 includes a demultiplexer (DEMUX) 210 to demultiplex the ADC output to N paths. For any given control code n of the PI 120, the sampling clock signal sin ($\omega$t), cos ($\omega$t), and the clock-to-signal interference signal (or simply referred to as interference) $V_{ck}(\phi)$ have a fixed phase relation of on. As a result, from the ADC output, the DIC circuit 200 captures a fixed voltage of $V_{ck}(\phi_n)$, which shows up as a baseline offset component for the path-n after the DEMUX 210. Basically, there is a one-to-one mapping from PI code n to the sampled interference voltage $V_{ck}(\phi_n)$. For example, a DIC circuit demultiplexes the ADC output and detects a baseline offset associated with the interference signal using a digital loop to calibrate the baseline offset. A DIC circuit may provide various digital processing techniques and algorithms to detect and cancel interference in different signal processing environments."

Each of the N paths, e.g., path-n, comprises a digital accumulation filter 211. The digital accumulation filter 211 comprises an adaptive feedback loop used to calibrate the baseline offset component $V_{ck}(\phi_n)$ in each of the N paths, and thus the interference $V_{ck}(\phi)$ is canceled out from the signal path. An accumulator is to sum up input values, typically sample points of a digital signal. The accumulation may be direct or weighted, depending on the design requirements, and can be reset based on specific conditions or thresholds. In particular, each digital accumulation filter 211 is configured to be a high pass filter, with a very low corner frequency that is controlled by a predetermined coefficient μ. Each loop uses an adaptation factor of $\mu/(1-Z^{-1})$ in an accumulator to obtain an accumulated value $V_n$ being converged to $V_{ck}(\phi_n)$ in each path-n corresponding to the control code n for directly canceling a component of interference signal with specific interference frequencies, where u is an adaptive rate of the loop and $Z^{-1}$ represents a unit delay in the digital filter domain. In particular, the digital accumulation filter 211 at least cancels a component of the baseline offset component associated with the phase of $2\pi n/N$ in the path-n. In an embodiment, the DIC circuit 200 is operated in the background with real signal traffic, to track process, voltage and temperature variation, and AFE setting adaptation. The adaptation $\mu/(1-Z^{-1})$ does not have to run for every sample in each of the N paths, and thus the DIC circuit 200 has a small power overhead.

In an embodiment, the DIC circuit 200 also measures the interference signal $V_{ck}(0)$ accurately. As shown in FIG. 1, DIC circuit 200 comprises an N-to-1 multiplexer 220 to recombine the N paths to produce a single output Vout. The accumulated values $V_n$ for each path-n of the N paths are collectively recombined to obtain an effective baseline offset value $V_N$ which is a result of the DIC circuit 200 making a detection of a sampled interference. However, in many application scenarios, large clock-to-signal interference takes a big portion of the full swing of ADC output, and thus, the sampled signal (real input signal mixed with the interference signal) must be compressed before into the digital domain. Additionally, the interference signal may be distorted by AFE nonlinearity, and thus cannot be completely removed by the digital cancellation loops 211 in the N paths. In an embodiment, analog cancellation is also desirable to remove at least part of the interference signal $V_{ck}(\phi)$ before it enters the ADC 150 so that a smaller (residue) interference signal may be further eliminated by the DIC circuit 200.

In this embodiment the detection of the sampled interference, i.e., the baseline offset value $V_N$, can presented as periodic and dominated by the coupled clock noise, $V_N=x_N$ cos ($\omega$t)+$y_N$ sin ($\omega$t), $x_N$ and $y_N$ are real and imaginary part of $x_N+jy_N$ in complex form. The coupled clock noise $x_N+jy_N$ (101) represents a dominant tone of the original clock-to-signal interference mixed into the signal path (see FIG. 1). The AIC circuit 300 is implemented in the clock path with an active noise cancellation circuit 310 to take the noise $V_N$ as an initial input and also a target of noise to be canceled. The active noise cancellation circuit 310 utilizes an analog calibration loop to generate a cancellation signal $V_C$, represented by $x_C$ cos ($\omega$t)+$y_C$ sin ($\omega$t) (with a complex form of $x_C+jy_C$ (301)), to cancel out the noise $V_N$. The cancellation signal $V_C$ determined by the calibration loop is injected back into the signal path to cancel the original (or at least part of) interference signal at the analog stage before the signal is digitized. This helps reduce the interference burden on the digital domain, allowing for cleaner initial signal capture. With the second domain of cancellation being added by the AIC circuit 300, the DIC circuit 200 just provides fine-tuned interference cancellation after the signal has been digitized. The adaptive filters 211 in the DIC 200 adjust to cancel out residual interference at multiple rotated phases in N paths, ensuring that the output signal (Vout) is clean. For example, an AIC circuit generates a cancellation signal based on control parameters from the DIC circuit and injects it into the signal path to cancel interference. In various implementations, an AIC circuit may utilize different analog components and calibration methods to generate and inject cancellation signals for interference reduction in various types of circuits."

Figure 2:
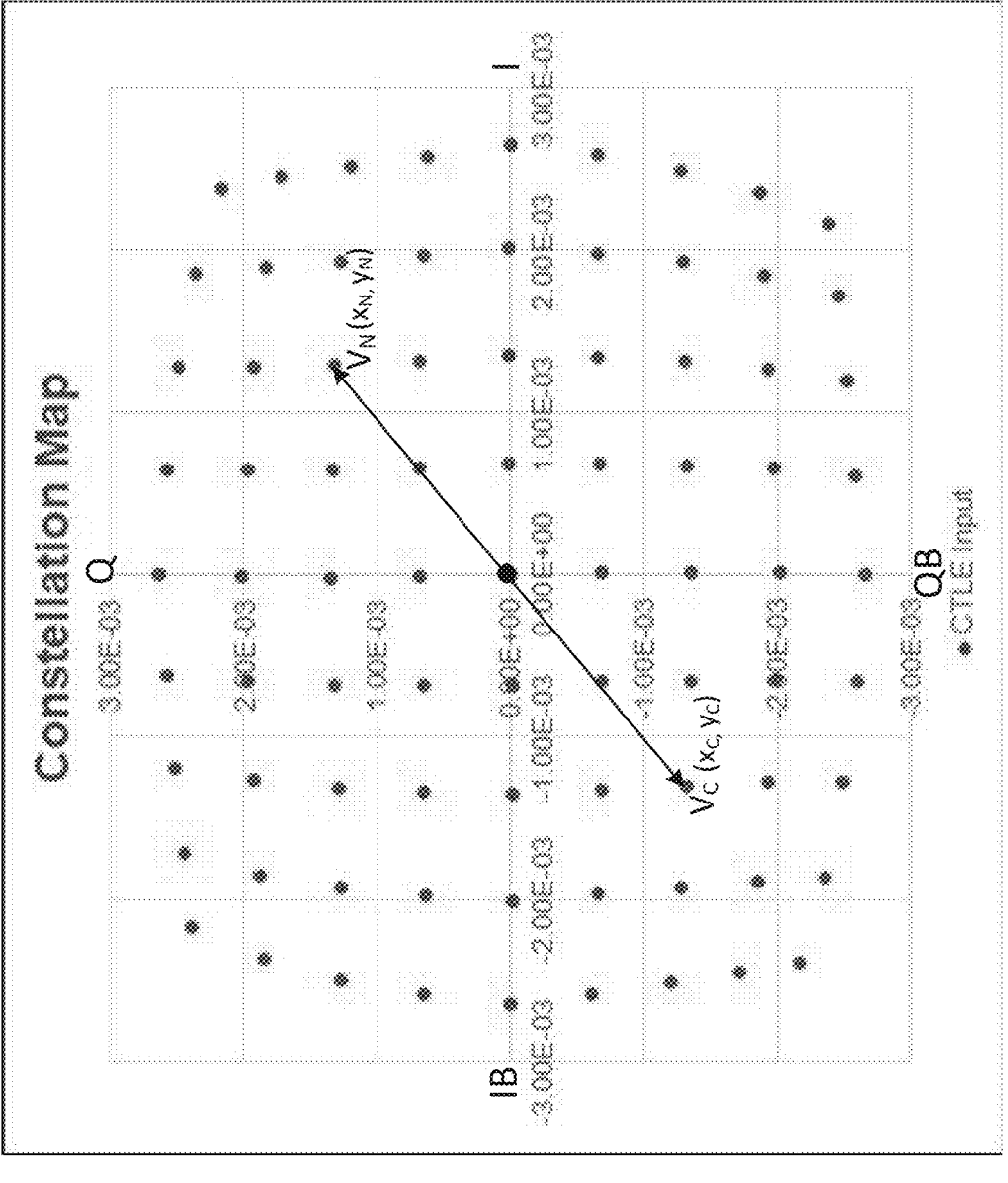
FIG. 2 is a constellation map to illustrate the interference $V_N$ and cancellation signal $V_C$ with substantially equal amplitude and 180-degree phase difference.

FIG. 2 is a constellation map to illustrate the noise $V_N$ and cancellation signal $V_C$ with substantially equal amplitude and 180-degree phase difference. The figure visually represents complex signals in terms of their in-phase (I) and quadrature (Q) components. In this diagram, the noise $V_N$ is represented by a vector ($x_N$, $y_N$), where the x component is the I component and the y component is the Q component. The cancellation signal $V_C$ is represented also by a vector ($x_C$, $y_C$). The magnitude of each vector represents the magnitude of the respective noise or signal. The direction of each vector represents the phase of the respective noise or signal. By adjusting the magnitude and phase of $V_C$, the cancellation vector can effectively neutralize the noise vector $V_N$. This is to illustrate the functionality of the AIC circuit 300 implemented in apparatus 100 to generate an active cancellation signal $V_C = x_C + jy_C$ to counteract the coupled clock noise $V_N = x_N + jy_N$. This would cancel out a big portion of the clock-to-signal interference $V_{ck}(\phi)$, and its residual amplitude is greatly reduced. Ideally, $V_C$ should have the same magnitude as $V_N$ but in the opposite direction (with an inverted phase), resulting in a net effect close to zero. Mathematically, this can be represented to minimize the amplitude of a residual noise $\sqrt{(x_N + x_C)^2 + (y_N + y_C)^2}$ after cancellation, which is a convex function of $x_C$ and $y_C$, and thus has a unique global optimum point.

Figure 3:
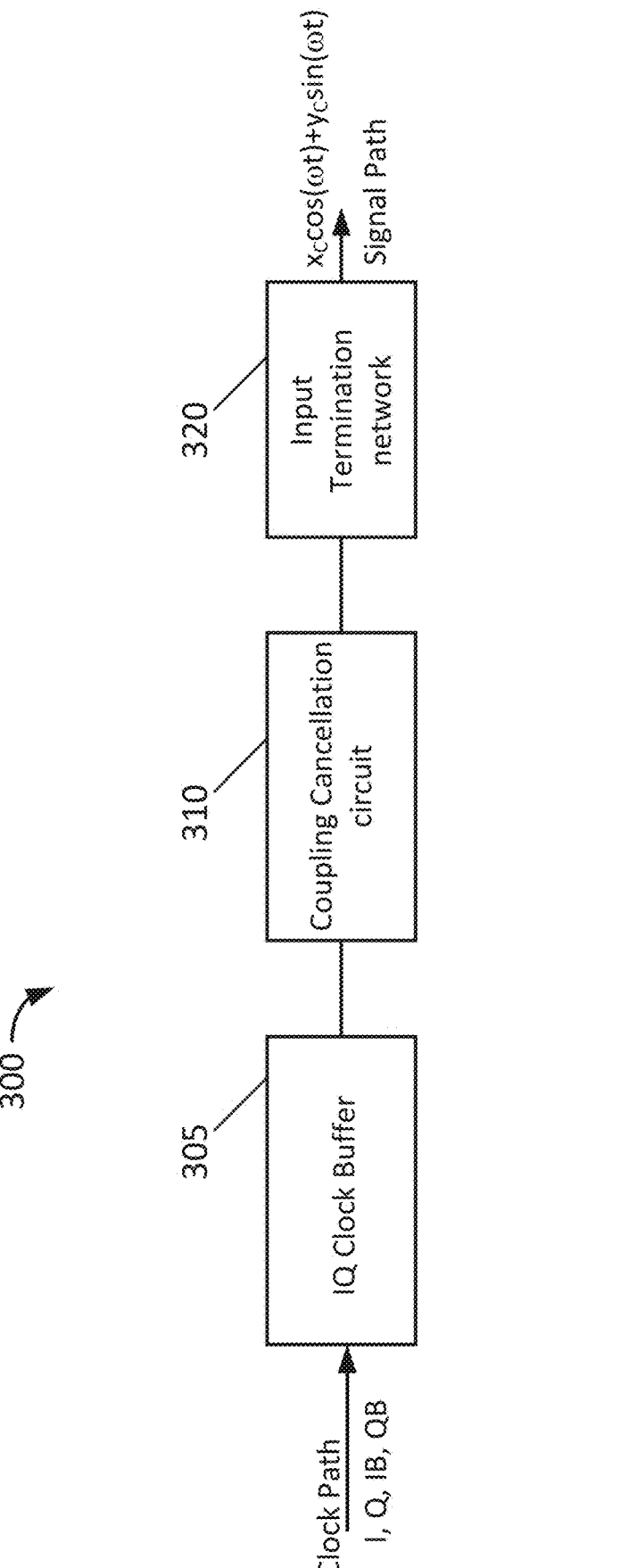
FIG. 3 is a simplified block diagram of the analog interference cancellation circuit in FIG. 1 according to an embodiment of the subject technology.

FIG. 3 is a simplified block diagram of the analog interference cancellation circuit in FIG. 1 according to an embodiment of the subject technology. This diagram is merely an example, which should not unduly limit the scope of the claims. One of ordinary skill in the art would recognize many variations, alternatives, and modifications. In an embodiment, the AIC circuit 300 (FIG. 1) includes an IQ clock buffer 305 in the clock path for producing buffered signals. Four buffered signals are produced: in-phase signal, I, in-phase buffered or inverted signal, IB, quadrature signal, Q, and quadrature buffered or inverted signal, QB. The IQ clock buffer 305 amplifies and stabilizes the four-phase clocks, providing a clean reference for the subsequent coupling cancellation circuit 310 to use the in-phase and quadrature signals to generate an accurate anti-phase cancellation signal. The IQ clock buffer also reduces the asymmetric loading effect in the clock path, placed between coupling cancellation circuit 310 and main clock buffers. In an embodiment, the coupling cancellation circuit 310 processes the I/Q clock signals and combines them to produce a signal that matches the amplitude and phase of the coupled clock noise $V_N$ but in the opposite phase. This (ideal) anti-phase signal, i.e., cancellation signal $V_C$, can be effectively used for canceling out the coupled clock noise $V_N$. Practically, the cancellation signal would at least cancel out a part of the coupled clock noise by minimizing a residue coupled clock noise. In an embodiment, the coupling cancellation circuit 310 includes a calibration loop with an initial input of $V_N = x_N + jy_N$ to choose the optimized value of $x_C$ and $y_C$ such that a residue coupled clock noise $\sqrt{(x_N + x_C)^2 + (y_N + y_C)^2}$ after is minimized. As shown in FIG. 3, after the optimal values for $x_C$ and $y_C$ are chosen, the cancellation signal $V_C = x_C + jy_C$ (301) will be injected into an injection node of an input termination network 320, which is a part of AFE in the signal path (see FIG. 1). The input termination network 320 provides proper termination to the main signal path with minimized reflections.

The major challenge is to determine the cancellation signal components $x_C$ and $y_C$. considering the interference components $x_N$ and $y_N$ change with process variation, the location of the core, and other factors that are hard to predict. In an embodiment, the amplitude of the residual clock noise after cancellation can be proximately represented by $\sqrt{(x_N + x_C)^2 + (y_N + y_C)^2}$ which is a convex function of $x_C$ and $y_C$, and thus has a unique global optimum point. Since $x_C$ and $y_C$ are orthogonal (as indicated in FIG. 2), they can be optimized independently. This means one does not have to search the whole two-dimensional space ($x_C$, $y_C$). Instead, scanning the x-axis and the y-axis can give the optimum $x_C$ and $y_C$, respectively. To overcome the non-ideality of real cancellation circuits, iterative scans can be performed for better results. A foreground calibration procedure can be performed with four iterative scans listed below. 1) Coarse x-scan: setting $y_C$ to 0, finding an optimal value of $x_C$ by adjusting the in-phase (I) buffer unit or inverted-phase (IB) buffer unit of the IQ clock buffer 305 based on a coarse control parameter $C_x$ inputted from the DIC circuit. This coarse x-scan process sweeps through all possible values of the coarse control parameter $C_x$ until the optimal value $x_C$ is found which minimizes the residue clock noise $\sqrt{(x_N + x_C)^2 + (y_N + y_C)^2}$; 2) Coarse y-scan: with the found coarse control $x_C$, finding an optimal value of $y_C$ by adjusting the quadrature-phase (Q) buffer unit or inverted-quadrature (QB) buffer unit of the IQ clock buffer 305 based on a coarse control parameter $C_y$ inputted from the DIC circuit. The coarse y-scan finds the optimal value of $y_C$ that minimizes the residue clock noise $\sqrt{(x_N + x_C)^2 + (y_N + y_C)^2}$; 3) Fine x-scan: based on the above coarse control results, tuning the fine control parameter $F_x$ leads to a fine-tuned value of $x_C$ which further minimizes the residue noise $\sqrt{(x_N + x_C)^2 + (y_N + y_C)^2}$; 4) Fine y-scan: further based on the fine x-scan results, tuning the fine control parameter $F_y$ leads to fine-tuned value of $y_C$ which additionally minimizes the residue clock noise $\sqrt{(x_N + x_C)^2 + (y_N + y_C)^2}$. The whole iterative coarse/fine scans then lead to the finding of the cancellation signal in terms of $x_C + jy_C$.

Figure 4:
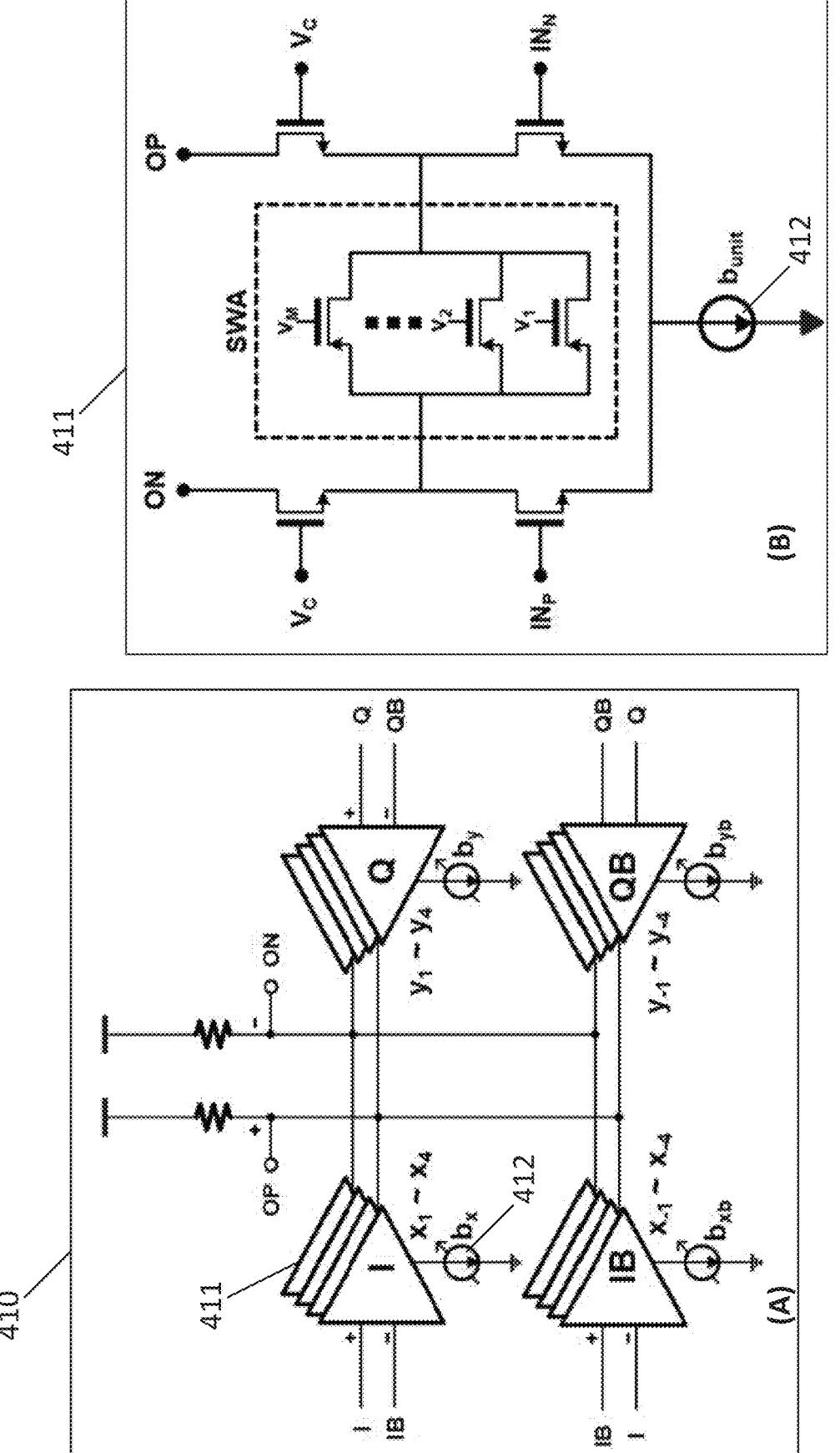
FIG. 4 is an exemplary circuit diagram realizing a coarse/fine control scan function of a coupling cancellation circuit in FIG. 3 with sub-unit buffers (A) each having a switch array (B) according to an embodiment of the subject technology.

FIG. 4 is an exemplary circuit diagram realizing the coarse/fine control scan function of the coupling cancellation circuit in FIG. 3 with sub-unit buffers (A) each having a switch array (B) according to an embodiment of the subject technology. This diagram is merely an example, which should not unduly limit the scope of the claims. One of ordinary skill in the art would recognize many variations, alternatives, and modifications. In an embodiment, a coupling cancellation circuit 410 shown in section A of FIG. 4 is implemented for the coupling cancellation circuit 310 of FIG. 3. The coupling cancellation circuit 410 includes four main unit buffers labeled I, IB, Q, and QB. Each unit buffer has multiple sub-unit buffers 411 controlled by respective adjustable current sources 412 to adjust the current in each sub-unit buffer for tuning both the phase and amplitude of the cancellation signal. These sub-unit buffers can be individually enabled or disabled through control signals, allowing precise adjustment of the overall signal amplitude. The multiple sub-unit buffers $x_1$-$x_4$ are for adjusting the differential I component (I-IB) and $y_1$-$y_4$ are for adjusting the differential Q component (Q-QB). Similarly, the multiple sub-unit buffers $x_{-1}$-$x_{-4}$ are for adjusting the differential IB component (IB-I), and $y_{-1}$-$y_{-4}$ are for adjusting the differential QB component (QB-Q). Adjustable current sources 412 provide more coarse control options under current adjustability, $b_x$, $b_{xb}$, $b_y$, and $b_{yb}$, respectively to I unit buffer, IB unit buffer, Q unit buffer, and unit QB buffer. The differential output voltage is generated at OP and ON nets where the vector sum of sub-unit buffers provides the overall signal amplitude and phase. In an embodiment, the selection of the sub-unit buffers and adjustment of unit currents are dictated by the coarse-control parameters inputted from the DIC circuit (200) based on the initial detection of the amplitude of the baseline offset associated with the sampled interference. In another embodiment, section B of FIG. 4 shows an implementation of the sub-unit buffer 411 with adjustable current source 412, including a switch array (SWA), with a set of M transistor switches in parallel configuration, in the load. The SWA is controlled respectively by a set of voltage control signal $v_M$ to provide fine amplitude adjustability. Selection of the set of voltage control signal $v_M$ may be dictated by the fine control parameters provided by the DIC circuit (200) based on the initial detection of the amplitude of the baseline offset associated with the sampled interference.

Referring to FIG. 4, by controlling the sub-unit buffers and providing fine amplitude adjustability, circuit 410 generates a signal with precise amplitude and phase characteristics. Each unit buffer (I, IB, Q, QB) handles a specific phase: I and IB: In-phase signals; Q and QB: Quadrature-phase signals. The combination of sub-units ($x_1$~$x_4$ and $y_1$~$y_4$) allows for amplitude tuning by enabling/disabling certain sub-units. Effectively, the amplitude tuning enables iterative coarse scans based on coarse control parameters $C_x$ and $C_y$ to find the coarse-controlled optimal values of $x_C$ and $y_C$. Additionally, the fine amplitude adjustability through $v_1$, $v_2$, and $v_M$, respectively to I unit buffer, IB unit buffer, Q unit buffer, and QB unit buffer enable iterative fine scans based on fine-control parameters $F_x$ and $F_y$ to find the fine-controlled or final optimal values of $x_C$ and $y_C$ that result in an overall-minimized residue coupled clock noise $\sqrt{(x_N+x_C)^2+(y_N+y_C)^2}$. Therefore, the final optimal values of $x_C$ and $y_C$ lead to a generation of the analog cancellation signal $V_C=x_C+jy_C$. The generated cancellation signal aims to cancel out clock-to-signal interference by being 180 degrees out of phase with the interference signal but of the same amplitude. By tuning both amplitude and phase using the coarse and fine controls of sub-unit buffers, circuit 410 may achieve an optimal cancellation of the interference signal. Referring to FIG. 1, this cancellation signal is just represented as the output 301 of the AIC circuit 300, which is injected through an injection point 110 back to the signal path for at least canceling out a major part (dominate coupled clock noise $V_N$) of the clock-to-signal interference $V_{ck}(\phi)$. For foreground analog calibration, the input signal should be zero with 50 ohm termination at the injection node 110. During background digital cancellation, regular signal traffic is coming as usual.

Figure 5:
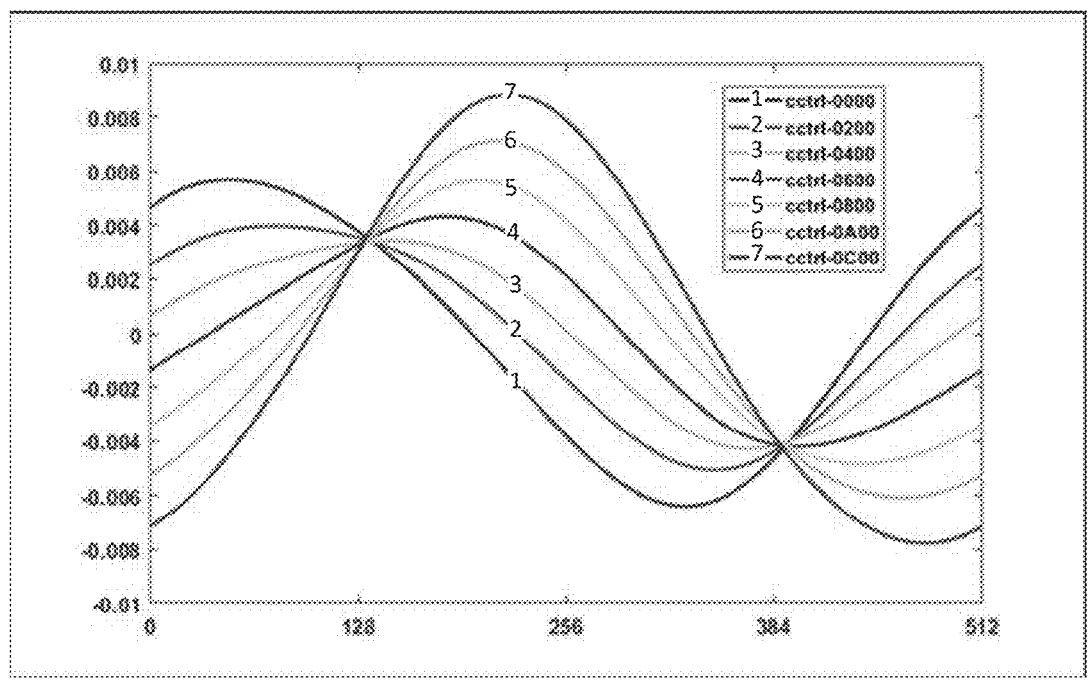
FIG. 5 shows simulation results of coupled clock noise through (A) I-domain scan and (B) Q-domain scan in the analog cancellation according to an embodiment of the subject technology.
Figure 5:
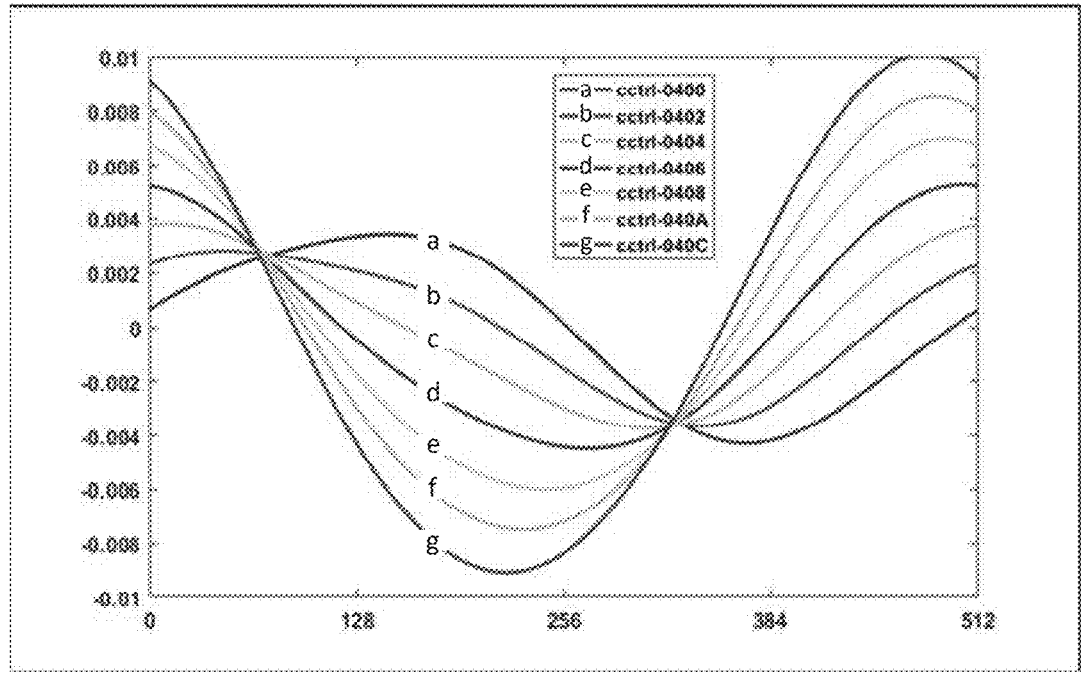

FIG. 5 shows simulation results of coupled clock noise through (A) I-domain scan and (B) Q-domain scan in the analog cancellation according to an embodiment of the subject technology. In an embodiment, the initial round of x-scan in the I domain is conducted to obtain coarse control x-code with the Q domain coarse control y-code being assigned at a default value. Part A of FIG. 5 shows a series of output waves after AFE corresponding to respective coarse control codes. The AFE output contains a combination of the interference signal $V_{ck}(\phi)$, and the cancellation signal $V_C$. The cancellation signal $V_C$ is chosen to at least cancel out a major part of the interference signal $V_{ck}(\phi)$ so as to yield the smallest swing of the residue coupled clock noise at AFE output. Through an initial round of sweeping coarse control for I domain (x-scan) with Q domain coarse control at default 00, the optimal coarse control code can be decided as 0400 based merely on the smallest amplitude swing in the figure. Part B of FIG. 5 further shows a series of AFE outputs corresponding to respective coarse control codes. Through an initial round of sweeping coarse control for the Q domain (y-scan) with I domain coarse control being assigned at 04, the optimal coarse control code can be decided as 0402 based merely on the smallest amplitude swing in the figure. Just use the cancellation signal based on this optimal coarse control code, the residue clock noise can be reduced from 12 mVpp to 6.4 mVpp in a simulation test. Two more sets of x-scan and y-scan provide 0704 as an optimal coarse control code.

FIG. 6 shows (A) simulation results and (B) table lists of residue clock noises through one or more rounds of scans in the analog cancellation according to an embodiment of the subject technology. Part A of FIG. 6 shows waveforms of the residue clock noises through one or more rounds of calibration scans in the analog cancellation. The waveforms are obtained through simulations based on foreground operation of the analog interference cancellation circuit 300 (FIG. 1) with comparisons on three scenarios of initial state, coarse scan, and fine calibration. As shown, the initial state without analog cancellation has the largest amplitude swing. After the initial coarse control sweep (including both coarse x-scan and coarse y-scan iterations), more optimal control codes are obtained to provide a corresponding cancellation signal injected into the signal path to cancel out a part of the clock-to-signal interference, resulting in lower amplitude swing. With fine control operations being added, it shows almost 10× reduction of the residue clock noise for the last fine control sweep.

Part B of FIG. 6 lists values of the residue clock noise after analog cancellation. At the initial state, the clock noise is measured at about 12.0 mVpp. After just the first round of coarse control sweep, the cancellation signal generated by the corresponding coarse control code is able to cancel part of the clock-to-signal interference, leading to the residue clock noise down to 6.4 mVpp. Additional rounds of coarse control sweep provide more optimal control codes, resulting in improved cancellation of the interference signal. The residue clock noise is reduced to 3.8 mVpp after the second round of coarse control sweep and further down to 1.6 mVpp after the third round of coarse sweep. After a fine control sweep, the residue clock noise is down to just 1.2 mVpp, which is a 10× reduction compared to the initial state. With the mixed-domain cancellation approach shown in FIG. 1, the remaining residue clock noise, after a major reduction by the analog interference cancellation, can be canceled by subsequent digital interference cancellation. These simulation tests affirm the subject technology of mixed-domain cancellation based on digital and analog calibration loops. Cancellation based on calibration loops does not rely on modeling and simulation accuracy, instead, it covers a wide range of interference levels and tracks process, voltage, and temperature variations.

Referring back to FIG. 1, apparatus 100 includes the digital interference cancellation circuit 200 serving a role as a detector of the clock-to-signal interference especially those coupled noise from process variation, voltage variation, and temperature variation. The detection operation can be conducted in the background, i.e., during signal communication, without interrupting normal operation. At the same time, apparatus 100 also includes the analog cancellation circuit 300 receives an input of control parameters based on the detected clock-to-signal interference and uses an analog calibration loop to generate an anti-phase cancellation signal. The Apparatus 100 allows the cancellation signal to be injected back into the signal path, aiming to cancel the clock-to-signal interference. This analog cancellation in fact is operated in the foreground to remove the majority of clock-to-signal interference at the start-up of the system for signal communication. Thus, the large interference signal would not be passed to cause a reduction of the dynamic range of ADC 150 and go through the nonlinearity of AFE 130. Additionally, the digital interference cancellation circuit 200, with its adaptive digital calibration loop being kept running in the background, can further remove small residue noises after the analog cancellation and track system variations to make the real communication signal cleaner. The subject technology of the mixed-domain clock-to-signal interference cancellation enables a higher level of SerDes integration without the problem of clock-to-signal coupling. The background adaptation in the digital domain leads to robust performance for the system.

While the above is a full description of the specific embodiments, various modifications, alternative constructions, and equivalents may be used. Therefore, the above description and illustrations should not be taken as limiting the scope of the present invention which is defined by the appended claims.

What is claimed is:

1. An apparatus comprising:

an analog front-end (AFE) module receiving an input signal from a signal path mixed with an interference signal from a clock path;

a track-and-hold (T/H) circuit configured to sample the input signal;

a phase interpolator implemented in the clock path and configured to generate multiple phases of a clock signal and to provide a timing rotated by the phases for the T/H circuit to sample the input signal and the interference signal in every cycle;

an analog-to-digital converter (ADC) configured to digitize the input signal and the interference signal to provide an ADC output; and a digital-interference-cancellation (DIC) circuit configured to demultiplex the ADC output and detect a baseline offset associated with the interference signal sampled at one of the phases in each demultiplexed path using a digital loop to calibrate the baseline offset.

2. The apparatus of claim 1, wherein the phase interpolator is configured to apply phase shifts of 2πn/N to generate the multiple phases, wherein n is an integer control code variable from 0 to N-1, to allow the T/H circuit to provide one sampled interference at corresponding one of the phases for a given n, wherein N is demultiplexing paths and an integer greater than one.

3. The apparatus of claim 2, wherein the DIC circuit is configured to detect the baseline offset resulting from the sampled interference at the same phase in every cycle for the control code n being at a fixed value.

4. The apparatus of claim 2, wherein the DIC circuit is configured to detect an additive periodic offset resulting from the sampled interference appeared at a rotating frequency given by 2πn/N for the control code n increasing linearly to track transmitting-receiving frequency offset.

5. The apparatus of claim 2, wherein the DIC circuit is configured to detect a random offset resulting from the sampled interference for the control code n changing randomly due to random jitter.

6. The apparatus of claim 2, wherein the T/H circuit is configured to sample the input signal as well as the interference signal with an optimized timing by detecting zero-crossings of the clock signal shifted by the multiple phases of 2πn/N.

7. The apparatus of claim 3, wherein the DIC circuit comprises a 1-to-N demultiplexer configured to demultiplex the ADC output to N paths, each path corresponding to the control code n comprising a digital accumulation filter to at least cancel a component of the baseline offset associated with the phase of 2πn/N.

8. The apparatus of claim 7, wherein the digital accumulation filter comprises an adaptive feedback loop using a factor of μ/(1−Z⁻¹) to obtain an accumulated value in each demultiplexed path, where u is an adaptive rate and Z⁻¹ represents a unit delay in the digital filter domain.

9. The apparatus of claim 8, wherein the DIC circuit further comprises an N-to-1 multiplexer to recombine the N paths to produce a single output with the accumulated value for each path being collectively recombined for canceling the baseline offset resulting from the sampled interference.

10. The apparatus of claim 8, wherein the DIC circuit is configured to be implemented in a background operation with the adaptive feedback loops concurrently with ongoing signal transmission with variations of process, voltage, and temperature.

11. The apparatus of claim 3, further comprises an analog-interference-cancellation (AIC) circuit configured with in-phase-quadrature (IQ) clock buffers in the clock path, the AIC circuit comprising a noise cancellation circuit configured to receive control parameters based on the baseline offset detected by the DIC circuit to generate an analog cancellation signal in a calibration loop.

12. The apparatus of claim 11, wherein the calibration loop is configured to use the control parameters in the IQ clock buffers to conduct iterative coarse/fine scans on finding real and imaginary components of the analog cancellation signal.

13. The apparatus of claim 11, wherein the AIC circuit is configured to operate in the foreground at system start-up time to inject the analog cancellation signal to the signal path to minimize a residue coupled clock noise entering the ADC circuit.

14. An apparatus comprising:

an analog front-end (AFE) module configured to receive an input signal from a signal path mixed with an interference signal from a clock path;

a phase interpolator (PI) circuit implemented in the clock path and configured to generate multiple phases of a clock signal;

a track-and-hold (T/H) circuit configured to sample the input signal and the interference signal based on a timing rotated in the phases generated by the PI circuit in every cycle;

an analog-to-digital converter (ADC) configured to provide an ADC digital output based on a sampled input signal and a sampled interference at each of the multiple phases;

a digital-interference-cancellation (DIC) circuit configured to detect the sampled interference by demultiplexing the ADC digital output into multiple paths each comprising a digital adaptive loop; and an analog-interference-cancellation (AIC) circuit implemented in the clock path to generate a cancellation signal based on a calibration loop using control parameters from the DIC circuit and to inject the cancellation signal to the signal path for canceling at least a part of the interference signal.

15. The apparatus of claim 14, wherein the PI circuit is configured to apply phase shifts of 2πn/N to generate the multiple phases, wherein n is an integer control code variable from 0 to N-1, to allow the T/H circuit to provide one sampled interference at corresponding one of the phases for a given n for the ADC circuit, wherein N is demultiplexing paths and an integer greater than one.

16. The apparatus of claim 15, wherein the DIC circuit is configured to detect a baseline offset in each digital adaptive loop at the phase of 2πn/N in every cycle per each n of the N demultiplexing paths, wherein accumulation of all baseline offsets in the N demultiplexing paths leads to determination of the control parameters for minimizing the amplitude of the sampled interference.

17. The apparatus of claim 16, wherein the AIC circuit is configured to determine a real-part component and an imaginary-part component in a calibration loop to generate the cancellation signal with a minimized residue difference in amplitude but with 180 degrees of phase difference relative to the interference signal.

18. The apparatus of claim 17, wherein the calibration loop is configured to independently determine the real-part component and the imaginary-part component using the control parameters in iterative coarse-control scans and fine-control scans.

19. The apparatus of claim 18, wherein the AIC circuit comprises a coupling cancellation circuit comprising four unit buffers for respectively tuning original and inverted in-phase and quadrature-phase components (I, Q, IB, QB) to perform the coarse-control scans, each unit buffer further comprising multiple sub-unit buffers each having a switch array to perform the fine-control scans.

20. A method comprising:

receiving an input signal from a signal path mixed with an interference signal from a clock path;

implementing a phase interpolator (PI) in the clock path to generate multiple phases of a clock signal;

sampling the input signal and the interference signal based on a timing rotated in the phases generated by the PI in every cycle;

providing an ADC digital output based on a sampled input signal and a sampled interference at each of the phases;

detecting the sampled interference by demultiplexing the ADC digital output and canceling at least partially a component of the interference signal in each demultiplexed path using a digital adaptive loop to calibrate the sampled interference;

generating an analog cancellation signal based on a calibration loop using control parameters determined in the digital adaptive loop; and injecting the analog cancellation signal into the signal path for at least canceling a part of the interference signal.

\* \* \* \* \*